United States Patent [19]

Tanagawa

[11] Patent Number: 5,059,828
[45] Date of Patent: Oct. 22, 1991

[54] PROGRAMMABLE LOGIC ARRAY CIRCUIT HAVING A GATE TO CONTROL AN OUTPUT CONDITION STATE OF A LATCH THEREOF

[75] Inventor: Kouji Tanagawa, Tokyo, Japan

[73] Assignee: Oki Electric Industry Co., Ltd,., Japan

[21] Appl. No.: 498,269

[22] Filed: Mar. 23, 1990

[30] Foreign Application Priority Data

Apr. 6, 1989 [JP] Japan ................... 1-40748[U]

[51] Int. Cl.⁵ ........................................ H03K 19/177
[52] U.S. Cl. ..................................... 307/465; 307/449; 307/469; 307/481; 364/716
[58] Field of Search .............. 307/449, 452, 465, 481, 307/468–469, 272.2; 364/716

[56] References Cited

U.S. PATENT DOCUMENTS

| 4,675,556 | 6/1987 | Bazes | 307/469 X |
| 4,812,685 | 3/1989 | Anceau | 307/481 |
| 4,831,573 | 5/1989 | Norman | 364/716 |
| 4,876,466 | 10/1989 | Kondou et al. | 364/716 X |
| 4,886,987 | 12/1989 | Usami | 307/449 X |
| 4,912,348 | 3/1990 | Maki et al. | 307/465 |

OTHER PUBLICATIONS

Greenspan, "Multiple Partitioned Programmable Logic Array", *IBM T.D.B.*, vol. 19, No. 5, Oct. 1976, pp. 1780–1781.

*Primary Examiner*—David Hudspeth
*Attorney, Agent, or Firm*—Edward D. Manzo

[57] ABSTRACT

A programmable logic array circuit which has a decoder, a sense amplifier and a latching circuit. The decoder decodes an instruction code into an output signal after a first precharge timing. The latching circuit latches the output signal from the decoder immediately before a second precharge timing. The gate circuit controls an output operation of the latching circuit in response to a prescribed timing signal.

7 Claims, 3 Drawing Sheets

PROGRAMMABLE LOGIC ARRAY CIRCUIT HAVING A GATE TO CONTROL AN OUTPUT CONDITION STATE OF A LATCH THEREOF

BACKGROUND OF THE INVENTION

1. Field of the Invention

The present invention relates to a programmable logic array (PLA) circuit and more particularly to a PLA circuit suitable for control circuits such as microcomputers, microprocessors and digital signal processors.

2. Description of Prior Art

A programmable logic array is a general-purpose logic structure consisting of an array of logic circuits. The way in which these circuits are programmed determines how input signals to the PLA are processed. For example, the PLA can be incorporated in a one-chip microcomputer to decode instructions and to produce control signals to various internal circuits.

A PLA circuit is disclosed in Japanese Patent Publication, (KOKAI) No. 59-100627 (Reference 1) and (KOKAI) No. 60-223326 (Reference 2.)

Reference 1 discloses a dynamic PLA circuit that includes at least two serially connected transistor groups and that performs a pre-charging/pull-down operation in synchronism with a clock signal. In each of the transistor groups, transistors have the conductive paths passes connected in parallel and control gates each connected to a data input line of each row. These transistor groups have a node which is prechargable during operation. An AND arithemetic result is output from one end of the serially connected transistor groups when the other end of the transistor groups is pulled-down, at least, to a low voltage at prescribed intervals during operation.

Reference 2 discloses a PLA circuit in a partial dynamic structure which is constructed with an AND-OR plane. In the PLA circuit, an output from the AND plane is input during precharge of the OR plane and then an output from the OR plane is read out as a PLA output during precharge of the AND plane. In this manner, the circuit is structurally simplified by precharging alternately the OR and AND planes.

However, the prior art PLA circuit has the following disadvantages.

The PLA circuit in reference 1 has a disadvantage in that an PLA output cannot be obtained during its precharge duration.

The PLA circuit in reference 2 cannot provide a PLA output during the precharge of the OR plane. This means that the prior art PLA circuits cannot utilize, effectively and arbitrarily, PLA output during the entire precharging period. This shortcoming lowers the speed of a control circuit with the PLA circuit and results in both low operational speed of instructions and low throughputs.

SUMMARY OF THE INVENTION

Accordingly, in order to overcome the problems, of the prior art it is an object of the present invention to provide a PLA circuit which can provide a PLA output throughout the entire precharging period.

Another object of the present invention is to provide a PLA circuit suitable for use in semiconductor integrated digital circuits.

Still another object of the present invention is to provide a PLA circuit suitable for use in microcomputers.

In order to solve the above problems, a PLA circuit according to the present invention comprises means for decoding a prescribed signal after a first precharge timing; means for latching the signal from the decoder means immediately before a second precharge timing; and gate circuit means for controlling a passage of an output of the latching means therethrough with a prescribed timing.

A programmable logic array system according to the present invention comprises decoding means having a plurality of input lines and a plurality of output lines. The decoding means decodes an instruction from an instruction register so as to select a specific one of the plurality of output lines during a first precharging period. Also, it performs a logical operation between the specific output line and a timing signal from a timing and control circuit during the first timing period. A wired logical circuit is connected to the plurality of the output lines of the decoding means. A plurality of sense amplifying means is provided, each connected to one of the plurality of output lines of the decoding means for amplifying an output from the wired logical circuit. Each of a plurality of latching means respectively connected to the plurality of sense amplifiers for latching an output from the decoding means immediately before a second precharging operation. A plurality of logical circuits is connected to the latching means in accordance with prescribed timing signal.

According to a PLA circuit according to further aspects of the present invention, a decoder decodes signals needed during a precharging period before the precharging period legions. The output of the decoder is latched immediately before precharging. Then the output of the latch circuit is combined in a logical operation with a predetermined timing signal during a precharging period by a gate circuit to provide the result as a PLA output.

DESCRIPTION OF THE PREFERRED EMBODIMENT

Figure 1:
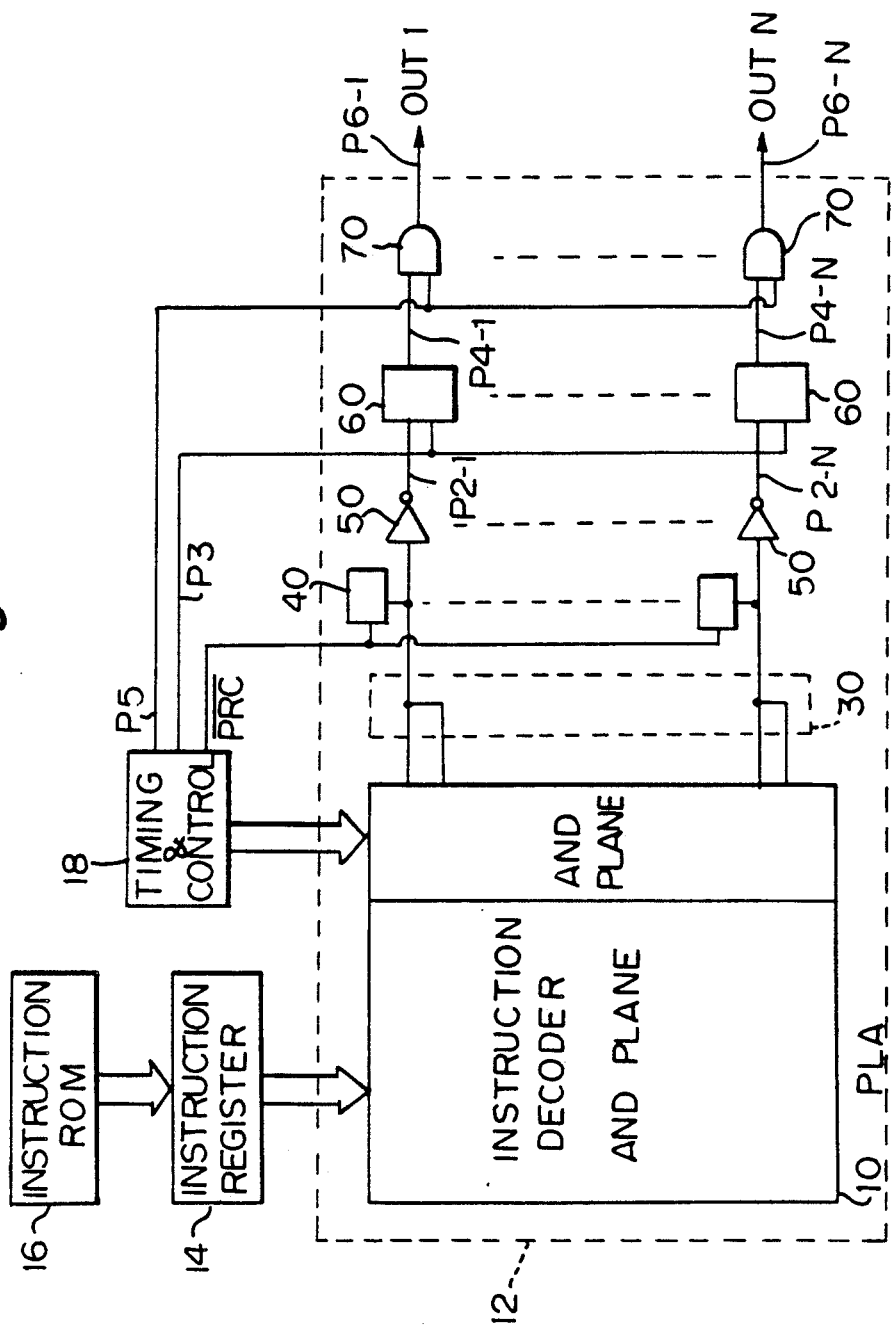
FIG. 1 is a block diagram showing a digital circuit system having a PLA circuit according to the present invention.

FIG. 1 is a block diagram showing a digital circuit system such as a microcomputer having a PLA circuit according to a first embodiment of the present invention. The system in FIG. 1 comprises a PLA circuit 12, an instruction register 14, an instruction read-only memory (ROM) 16 and a timing and control (T&C) circuit 18. The instruction ROM 16 stores instructions and produces them to instruction register 14 in response to a control signal. The instruction register 14 stores temporary instruction data from the instruction ROM 16. The T&C circuit 18 provides timing signals to the PLA circuit 12. The circuit 18 also produces a precharge signal $\overline{PRC}$, a latching signal $P_3$, and output control timing signal $P_5$. The PLA circuit 12 includes an instruction decoder 10 and a wired OR circuit 30. The instruction decoder 10 comprises a first AND section, which decodes an instruction from the instruction register 14 so as to select a specific output line, and a second AND section which performs an AND operation between the specific output line and a timing signals from the T&C circuit 18 to transfer a signal necessary for instruction execution to a sense amplifier 50.

Figure 2:
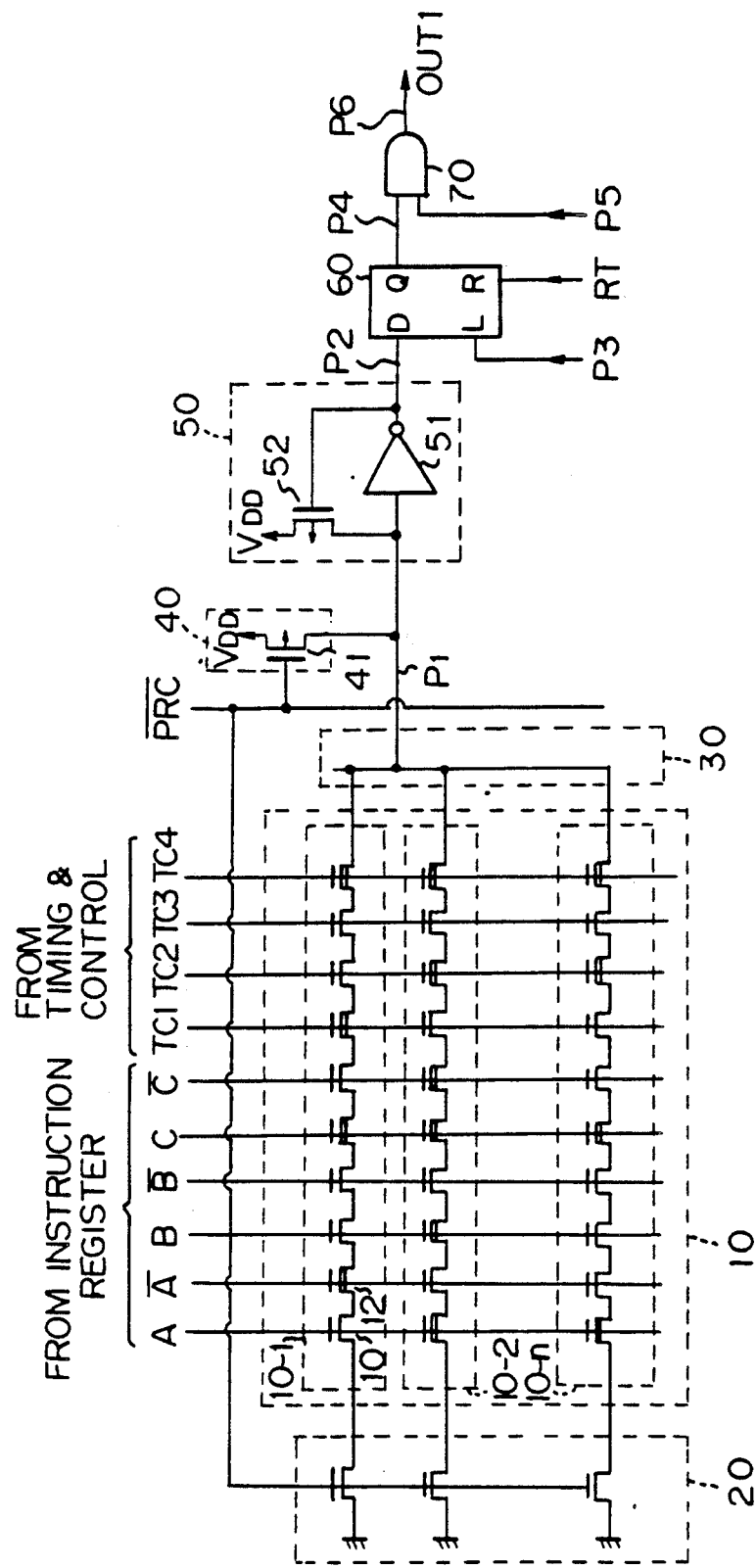
FIG. 2 is a circuit diagram showing an embodiment of an improved PLA circuit according to the present invention.

FIG. 2 is a detailed circuit diagram showing an embodiment of a PLA circuit according to the present invention.

PLA circuits are generally used in a microcomputer or a related device. The PLA circuit includes a plurality of decoders 10-1, 10-2 . . . , and 10-n each of which decodes a plurality of complementary input signals A, $\overline{A}$, B, $\overline{B}$, C, $\overline{C}$ as an instruction code. Each of the plurality of decoders 10-1, 10-2, . . . , and 10-N comprises a NAND circuit which consist of enhancement type MOS transistors 11 and depletion type MOS transistors 12 serially connected to one another. A precharge circuit 20 is formed of a plurality of N-channel MOS transistors at one end of the decoders 10-1, 10-2, . . . , and 10-N, with the gates of the N channel MOS transistors being connected commonly to a precharge signal $\overline{PRC}$. Outputs of the precharge circuit at the other end of the decoders 10-1, 10-2, . . . , and 10-N are coupled at a wired OR circuit 30. The wired OR circuit 30 has an output P1 connected to the precharge circuit 40 and the sense amplifier 50. The precharge circuit 40 is formed of a P-channel MOS transistor 41 with a gate connected to the precharging signal $\overline{PRC}$. The sense amplifier 50 consist of an inverter 51, which amplifies and inverts the output P1 of the wired OR circuit 30, and a P-channel MOS transistor 52 for waveform shaping which performs a positive feedback operation of the output P2 of the inverter 51. The latching circuit 60 comprises an input terminal D connected to the output P2 of the sense amplifier 50, a clock terminal L receiving a timing signal P3, a reset terminal R receiving a reset signal RT, and an output terminal Q. The latching circuit 60 may be a D-type flip-flop. A two input AND gate circuit 70 receives the output P4 from the output terminal Q and a timing signal P5. The two input AND gate 70 provides an output P6 as the output of the PLA circuit.

Figure 3:
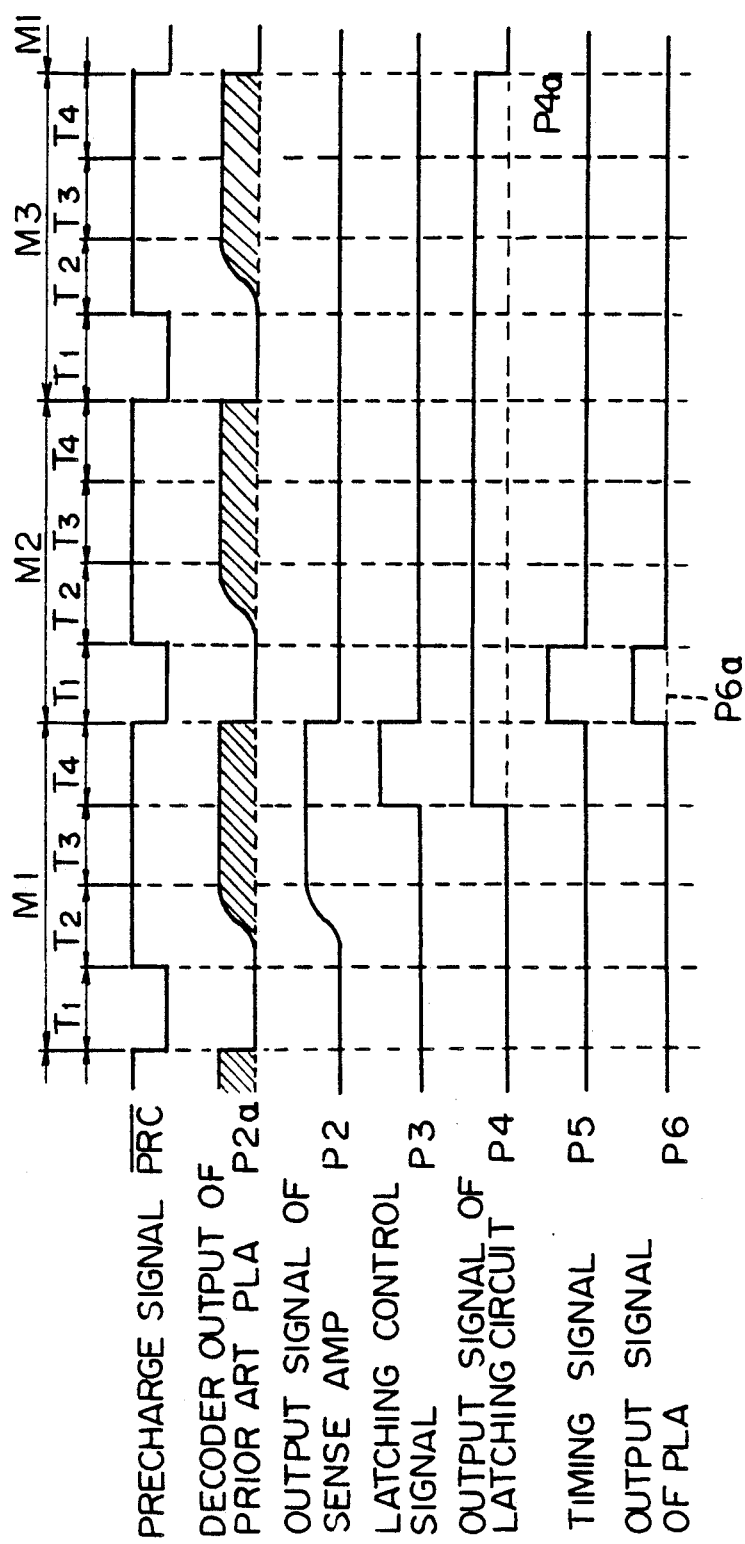
FIG. 3 is a timing chart for the PLA circuit shown in FIG. 2.

FIG. 3 is a timing chart for performing an instruction execution of the PLA circuit seen in FIG. 1. The operation of the PLA circuit in FIG. 1 will be explained with reference to FIG. 2 and FIG. 3.

In FIG. 3, for example, the machine cycles M1 through M3 are used for executing an instruction from a microcomputer having a PLA circuit according to the present invention. Each of the machine cycles M1 to M3 is formed of four, sequential states or times T1 to T4.

Generally, in the machine cycle (or first precharging period) M1, state T1 to T2 is a fetch period of an instruction to define the instruction code A, $\overline{A}$, B, $\overline{B}$, and C, $\overline{C}$, shown in FIG. 2. In the PLA circuit, the precharging operation is performed in state T1 of the machine cycle M1. It will be noted that $\overline{PRC}$ is low during state T1 but is otherwise high. A reset signal RT is applied to the latching circuit 60 during state T1 of machine cycle M1. States T3 and T4 of the machine cycle M1 are an instruction execution period during which an output P6, which is obtained by decoding the instruction code A, $\overline{A}$, . . . C, and $\overline{C}$, latched is used. The timing signal P3 is supplied during state T4 of the machine cycle M1. During states T1 and T2 of the machine cycle (or second precharging period), M2, the instruction code A to C changes again to modify instruction or provide the second byte of the instruction. For this reason, a re-charge operation is performed in this period. A timing signal P5 is high in state T1 of machine cycle M2. States T3 and T4 of the machine cycle M2 comprise a period for an instruction execution based on an instruction code, A, $\overline{A}$, . . . C, $\overline{C}$, which is defined in states T1 and T2 of the machine cycle M2. The above described is description also applicable for the machine cycle M3.

With reference to the timing chart of FIG. 3, we now describe how a PLA output P6 is obtained in a precharing period which is state T1 of machine cycle M2.

First, when precharging signal $\overline{PRC}$ drops to its low (L) level at the state T1 of machine cycle M1, precharging circuit 20 is on, while precharging circuit 40 is off, so that the output of the wired OR circuit 30 is precharged to a power source potential Vdd. In the machine cycle M1, an instruction code A, $\overline{A}$, . . . and C, $\overline{C}$ is decoded by the decoders 10-1, 10-2, . . . , 10-N. In this case, the decoders 10-1, 10-2, . . . , and 10-N can be decoded with respect to any input combination by properly combining the enhancement MOS transistors 11 and the depletion MOS transistors 12. Hence the precharging signal $\overline{PRC}$ is at a H level, so that the precharging circuit 20 is turned on, while the precharging circuit 40 is turned off. Therefore, a precharging operation terminates so that the output of the wired OR circuit 30 is decreased to a ground potential. In the sense amplifier 50, the inverter 51 inverts the output at the node P1 and drives its output P2 high. When the latching circuit 60 latches the output P2 in response to a timing signal P3 (at state T4 of machine cycle M1), it drives its Q output P4 high. Next, in the machine cycle M2, when the timing signal P5 is a H level at the state timing T1 for a precharging period, AND gate 70 is enabled and transmits the output P6, also during state T1. In the same manner as described above, the PLA output P6 is obtained at state T2 of the machine cycle M2, at the state T1 of the machine cycle M3, and at state T2 of the machine cycle M3.

When the instruction decoder 10 does not decode an instruction from the instruction register 14, latching circuit 60 produces an output signal P4a in a low level, so that the AND gate 70 produces an output P6a in a low level, as shown in FIG. 3.

The present embodiment has the following advantages. In a prior art PLA circuit, the PLA output cannot be utilized during a precharging period because the output P2 of the sense amplifier 50 has a low level during precharging, as shown by the output waveform P2a of FIG. 3, so that the output P2a of the sense amplifier 50 is fixed at a L level. However, according to a PLA circuit of the present invention, the decoders 10-1, 10-2, . . . and 10-N are constructed so as to provide a PLA output P6 during a precharging operation in states T1 or T2 of the machine cycle M2 or M3 for example, or in state T4 of the machine cycle M2. Also, in the PLA circuit, the latching circuit 60 latches the output at the node P1 through the sense amplifier 50, and the AND logic circuit 70 carries out a logical product of the latched output and a timing signal P5, so that the PLA output P6 is obtained in the timing T1 of the machine cycle M2. As a result, the PLA output P6 can be obtained even during a precharging operation in the period M2 (T1 and T2) or M3 (T1 and T2). This feature enables the realization of a PLA circuit with no timing loss, which is suitable for the control circuit of a microcomputer, thus improving the execution speed of instructions and system throughput.

The present invention should not be limited to the embodiment shown in FIGS. 1 and 2. The embodiment according to the present invention may be modified as follows:

(a) The NAND circuit may be constructed of an AND gate with an inverter.

(b) The gate circuit may be a gate of another type such as a NAND gate.

(c) The wired OR circuit 30 also may be constructed with gate circuits. The PLA circuit according to the present invention is applicable for other digital apparatus.

As described above in detail, the PLA circuit according the present invention can provide an output during a precharging period by arranging a new connection of a decoder, latching circuit and a gate circuit. Therefore, the PLA circuit can provide an effective timing as a control circuit for a microcomputer and improves execution speed of instruction and throughput.

What is claimed is:

1. A programmable logic array circuit comprising:
   means for decoding a prescribed signal after a first precharge timing;
   means for latching an output signal from said decoder means immediately before a second precharge timing; and
   gating means for controlling a passage of a output from said latching means therethrough with a predetermined timing signal.

2. A programmable logic array circuit according to claim 1, wherein said decoding means comprises a NAND circuit which is comprised of a plurality of MOS transistors serially connected; said MOS transistors including an enhancement MOS transistor and a depletion MOS transistor; the gates of said MOS transistors being connected so as to receive an instruction code.

3. A programmable logic array circuit according to claim 1, wherein said latching means comprises an inverter having an input for receiving an output from the decoding means and a MOS transistor having a gate connected to the output of the inverter, a first electrode connected to the input of the inverter and a second electrode connected to a fixed potential.

4. A programmable logic array circuit according to claim 1, wherein said latching means comprises a D-type flip flop.

5. A programmable logic array circuit according to claim 1, wherein said gating means comprises an AND gate.

6. A programmable logic array system comprising:
   decoding means having a plurality of input lines and a plurality of output lines, said decoding means for decoding an instruction from an instruction register so as to select a specific one of said plurality of output lines during a first precharging period and for performing a logical operation between the specific output line and a timing signal from a timing and control circuit during the first timing period;
   a wired logical circuit connected to said plurality of the output lines of the decoding means;
   a plurality of sense amplifying means each connected to one of the plurality of output lines of the decoding means for amplifying an output from the wired logical circuit;
   a plurality of latching means respectively connected to said plurality of sense amplifiers for latching an output from said decoding means immediately before a second precharging operation; and
   a plurality of logical circuits connected to the latching means for controlling an output operation of the latching means by a prescribed timing signal.

7. A programmable logic array circuit comprising:
   a decoder configured to decode a prescribed signal in response to a first precharge signal, the decoder having an output providing an output signal;
   a latch coupled to the decoder and configured to latch the decoder output signal prior to a second precharge timing signal; and
   a logic gate circuit coupled to the latch and configured to pass an output in response to a predetermined timing signal.

* * * * *